(12) United States Patent
Fujimoto et al.

(10) Patent No.: US 9,383,205 B2
(45) Date of Patent: Jul. 5, 2016

(54) VIBRATOR AND VIBRATING GYROSCOPE

(71) Applicant: Murata Manufacturing Co., Ltd., Nagaokakyo-shi, Kyoto-fu (JP)

(72) Inventors: Katsumi Fujimoto, Nagaokakyo (JP); Toshimaro Yoneda, Nagaokakyo (JP); Takuo Hada, Nagaokakyo (JP); Hideya Horiuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 254 days.

(21) Appl. No.: 14/148,964

(22) Filed: Jan. 7, 2014

(65) Prior Publication Data

US 2014/0116188 A1    May 1, 2014

Related U.S. Application Data

(63) Continuation of application No. PCT/JP2012/069425, filed on Jul. 31, 2012.

(30) Foreign Application Priority Data

Aug. 1, 2011   (JP) .................................. 2011-168499

(51) Int. Cl.
*G01C 19/56* (2012.01)
*G01C 19/5607* (2012.01)
(Continued)

(52) U.S. Cl.
CPC ............ *G01C 19/56* (2013.01); *G01C 19/5607* (2013.01); *G01C 19/5621* (2013.01); *H01L 41/09* (2013.01); *Y10T 74/12* (2015.01); *Y10T 74/18856* (2015.01)

(58) Field of Classification Search
CPC ............... G01C 19/56; G01C 19/5719; G01C 19/5621; G01C 19/5607; G01C 19/574; G01P 15/097; G01P 15/09; G01P 15/0802; G01P 15/18; G01P 15/14
USPC ............... 73/504.12, 504.14, 504.04, 504.15, 73/514.29, 514.36, 514.38
See application file for complete search history.

(56) References Cited

U.S. PATENT DOCUMENTS 4,182,187 A  * 1/1980 Hanson ................... G01L 1/086
                                                                  177/210 C
5,438,231 A    8/1995 Khoshnevisan et al.
(Continued)

FOREIGN PATENT DOCUMENTS

DE    102007018834 A1   10/2008
JP       09-105634 A     4/1997
(Continued)

OTHER PUBLICATIONS

Official Communication issued in International Patent Application No. PCT/JP2012/069425, mailed on Aug. 28, 2012.

*Primary Examiner* — Helen Kwok
(74) *Attorney, Agent, or Firm* — Keating & Bennett, LLP

(57) ABSTRACT

A vibrator includes first and second circular or substantially circular arc-shaped beam portions, a base end-side weight portion, and a base end-side weight portion joining portion. The end portions of the first and second circular or substantially circular arc-shaped beam portions in an X-axis positive direction face each other across a distance in a Y-axis direction, and the end portions thereof in an X-axis negative direction are joined to each other. The base end-side weight portion is disposed between the first and second circular or substantially circular arc-shaped beam portions. The base end-side weight portion joining portion extends from a joining portion between the first circular or substantially circular arc-shaped beam portion and the second circular or substantially circular arc-shaped beam portion in the X-axis positive direction, and joined to the base end-side weight portion.

19 Claims, 10 Drawing Sheets

(51) Int. Cl.
*G01C 19/5621* (2012.01)
*H01L 41/09* (2006.01)

(56) References Cited

U.S. PATENT DOCUMENTS

| | | | |
|---|---|---|---|
| 5,644,083 A * | 7/1997 | Newell | G01P 1/003 |
| | | | 73/514.13 |
| 5,698,784 A | 12/1997 | Hotelling et al. | |
| 2005/0284223 A1* | 12/2005 | Karaki | G01C 19/5719 |
| | | | 73/504.12 |
| 2007/0013364 A1* | 1/2007 | Brisson | G01P 15/097 |
| | | | 73/514.29 |
| 2009/0064783 A1 | 3/2009 | Ohuchi et al. | |
| 2009/0126488 A1 | 5/2009 | Fujimoto et al. | |
| 2010/0126270 A1* | 5/2010 | Terada | G01C 19/5719 |
| | | | 73/504.12 |
| 2013/0228012 A1 | 9/2013 | Ohuchi et al. | |

FOREIGN PATENT DOCUMENTS

| | | |
|---|---|---|
| JP | 2000-504106 A | 4/2000 |
| JP | 2001-082963 A | 3/2001 |
| JP | 2011-047852 A | 3/2011 |
| WO | 2007/086337 A1 | 8/2007 |
| WO | 2008/010336 A1 | 1/2008 |
| WO | 2008/128728 A1 | 10/2008 |

* cited by examiner

VIBRATOR AND VIBRATING GYROSCOPE

BACKGROUND OF THE INVENTION

1. Field of the Invention

The present invention relates to a vibrator having a vibration mode of in-plane vibration in a main surface and a vibration mode of out-of-plane vibration in a direction perpendicular or substantially perpendicular to the main surface, and a vibrating gyroscope detecting an angular velocity applied to a vibrator around a rotation axis perpendicular or substantially perpendicular to the vibration direction of each of the two vibration modes.

2. Description of the Related Art

A vibrating gyroscope detecting an angular velocity includes a vibrator having a first vibration mode (drive vibration mode) of vibrating along a drive axis perpendicular to a rotation axis and a second vibration mode (detection vibration mode) of vibrating along a detection axis perpendicular to the rotation axis and the drive axis. When the vibrator vibrating in the drive vibration mode rotates around the rotation axis, a Coriolis force along the detection axis is applied to the vibrator. When the Coriolis force is applied, the vibrator vibrates in the detection vibration mode. The vibration amplitude of the detection vibration mode becomes an amplitude according to the magnitude of the angular velocity of a rotational movement, in other words, the magnitude of the Coriolis force occurring owing to the angular velocity of the rotational movement. Therefore, by detecting the vibration amplitude of the detection vibration mode, it may be possible to detect the angular velocity of the rotational movement.

The structure of a vibrator used for a vibrating gyroscope varies. A type of vibrator is configured as a tuning fork-type vibrator including two cantilever beams (See, for example, International Publication No. WO2008/010336).

FIG. 1A is a plan view of a vibrating gyroscope 111 including a tuning fork-type vibrator of the related art, and FIG. 1B is the partial cross-sectional view thereof.

The vibrating gyroscope 111 includes a vibrator 101 serving as the tuning fork-type vibrator. The vibrator 101 includes leg portions 101A and 101B, a supporting portion 101C, and a base portion 101D. Each of the leg portions 101A and 101B is formed into a meander shape. One end side of each of the leg portions 101A and 101B is joined to the base portion 101D, and serves as a fixed end. The other end side of each of the leg portions 101A and 101B serves as a free end. The supporting portion 101C is disposed between the leg portions 101A and 101B, and formed so as to extend from the base portion 101D in the same direction as the leg portions 101A and 101B. The vibrator 101 includes a dielectric film 102, a piezoelectric body film 103, an electrode film 104, a substrate 105, and a common electrode 106. The dielectric film 102 is formed in the top surface of the substrate 105. The piezoelectric body film 103 is formed in the top surface of the dielectric film 102. The electrode film 104 is formed in the top surface of the piezoelectric body film 103. The common electrode 106 is formed in the bottom surface of the substrate 105, and connected to a ground. In the supporting portion 101C, the vibrator 101 is supported by a supporting substrate not illustrated.

The electrode film 104 includes electrodes 104A to 104C. The electrode 104A includes line-shaped portions individually following the leg portions 101A and 101B and the supporting portion 101C, and a portion connected to these line-shaped portions and formed in the base portion 101D. The electrode 104B is formed into a line shape so as to lead from an end portion of the leg portion 101A, which serves as the free end, to an end portion of the supporting portion 101C through the upper portion of the base portion 101D. The electrode 104C is formed into a line shape so as to lead from an end portion of the leg portion 101B, which serves as the free end, to an end portion of the supporting portion 101C through the upper portion of the base portion 101D.

The electrodes 104A to 104C, the common electrode 106, and the piezoelectric body film 103 configure an electromechanical conversion element. In the vibrator 101, a vibration is excited in such a manner that the end portions of the leg portions 101A and 101B, which serve as the free ends, move away from or come close to each other and are opened or closed. In the vibrating gyroscope 111, such a vibration mode is used as the drive vibration mode. In the vibrator 101, a vibration is excited in which the leg portions 101A and 101B perform bending vibration in the thickness directions thereof. In the vibrating gyroscope 111, such a vibration mode is used as the detection vibration mode. The vibrating gyroscope 111 detects the angular velocity, using the fact that when, in a state where a vibration occurs in the drive vibration mode, an angular velocity is applied to the vibrating gyroscope 111 around an axis parallel to the leg portions 101A and 101B, the vibrator 101 vibrates in the detection vibration mode due to the Coriolis force.

It is desirable that a detection sensitivity for an angular velocity is high in a vibrating gyroscope. In general, so as to enhance the detection sensitivity for the angular velocity in a vibrating gyroscope utilizing a tuning fork-type vibrator, it is necessary to adequately set the resonant frequency of a vibrator. Since the resonant frequency of the tuning fork-type vibrator is inversely proportional to the square of the length of a leg portion (beam), the resonant frequency becomes significantly high when the tuning fork-type vibrator has been miniaturized. In addition, the detection sensitivity becomes low as the resonant frequency becomes high. Therefore, in the vibrating gyroscope 111, by arranging the leg portions 101A and 101B in the meander shapes, it may be possible to maintain a long leg portion (beam) even if the vibrator 101 is miniaturized, and the resonant frequency of the vibrator 101 is prevented from becoming high.

Here, a relationship between the resonant frequency of the vibrator and the detection sensitivity for an angular velocity will be described.

The detection sensitivity for an angular velocity may be expressed as a value proportional to the product of the maximum value of the Coriolis force applied to the vibrator and a detected voltage (hereinafter, referred to as a detection efficiency) output per 1 N (Newton) of the Coriolis force. The maximum value of the Coriolis force may be expressed as the product of the mass of the vibrator, the maximum velocity of the displacement of the vibrator in the drive vibration mode, and an angular velocity applied to the vibrator. Accordingly, the detection sensitivity for the angular velocity may be expressed as a value proportional to the product of the detection efficiency, the mass of the vibrator, and the maximum velocity of the displacement of the vibrator in the drive vibration mode.

The detection efficiency, the mass of the vibrator, the maximum velocity of the displacement of the vibrator in the drive vibration mode, and so forth have correlations not only with the detection sensitivity but also with the thickness of the vibrator, a width dimension, a stiffness property, a resonant mode, and the resonant frequency thereof.

In recent years, the miniaturization of a vibrating gyroscope has been strongly desired. In general, when a vibrator becomes small, the resonant frequency of the vibrator becomes high. Therefore, when a vibrating gyroscope including a small vibrator has been installed in a digital camera or the like, a difference between the resonant frequency of the vibrator and the frequency of a hand movement becomes large. Therefore, a sensitivity for the hand movement or the like becomes low in some cases.

Therefore, the vibrator is caused to have a specific structure or the vibrator is caused to vibrate in a specific vibration mode, and hence, even if the vibrator is small, it may be possible to prevent the resonant frequency of the vibrator from being increased.

Furthermore, so as to improve the drift characteristic of the vibrating gyroscope, it is necessary for both of the drive vibration mode and the detection vibration mode to share a common node.

By supporting the vibrator using the common node, it may be possible to prevent a vibration from leaking from a supporting portion supporting the vibrator or prevent an undesired vibration from propagating from the outside, and it may be possible to obtain a good drift characteristic.

In the vibrator 101 including the leg portions 101A and 101B having the meander shapes, since end portions of the leg portions 101A and 101B are fixed ends, the end portions being joined to the base portion 101D, it is necessary to provide the base portion 101D whose stiffness property is high. Therefore, the base portion 101D turns out to account for a large percentage of the area of the vibrator 101, and even if the leg portions 101A and 101B have the meander shapes so as to make the vibrator 101 smaller, the ability to lower the resonant frequency of the vibrator 101 has been inevitably limited due to the base portion 101D.

SUMMARY OF THE INVENTION

Therefore, preferred embodiments of the present invention provide a vibrator capable of effectively decreasing a resonant frequency even if made smaller, and a vibrating gyroscope including the vibrator and being capable of detecting an angular velocity with a high sensitivity.

A vibrator according to a preferred embodiment of the present invention includes a first circular or substantially circular arc-shaped beam portion, a second circular or substantially circular arc-shaped beam portion, a base end-side weight portion, and a base end-side weight portion joining portion. In the first circular or substantially circular arc-shaped beam portion and the second circular or substantially circular arc-shaped beam portion, end portions on one side of a first axis direction face each other across a distance in a second axis direction perpendicular or substantially perpendicular to the first axis direction and end portions on the other side of the first axis direction are joined to each other. The base end-side weight portion is disposed between the first circular or substantially circular arc-shaped beam portion and the second circular or substantially circular arc-shaped beam portion. The base end-side weight portion joining portion is extends from a joining portion between the first circular or substantially circular arc-shaped beam portion and the second circular or substantially circular arc-shaped beam portion in the first axis direction, and joined to the base end-side weight portion.

The vibrator according to a preferred embodiment of the present invention has an in-plane vibration mode in which a distance between the end portions of the first circular or substantially circular arc-shaped beam portion and the second circular or substantially circular arc-shaped beam portion on the one side of the first axis direction changes, and an out-of-plane vibration mode in which the first circular or substantially circular arc-shaped beam portion and the second circular or substantially circular arc-shaped beam portion alternately bend in a third axis direction perpendicular or substantially perpendicular to the first axis direction and the second axis direction.

Since the first circular or substantially circular arc-shaped beam portion and the second circular or substantially circular arc-shaped beam portion have circular arc shapes, the first circular or substantially circular arc-shaped beam portion and the second circular or substantially circular arc-shaped beam portion are joined so as to be individually parallel or substantially parallel to the second axis direction, in the joining portion between the first circular or substantially circular arc-shaped beam portion and the second circular or substantially circular arc-shaped beam portion. Accordingly, even if a base portion is not provided in such a way as a vibrator of the related art, the joining portion between the first circular or substantially circular arc-shaped beam portion and the second circular or substantially circular arc-shaped beam portion becomes a substantial fixed end. Therefore, it is possible to omit a base portion provided in the vibrator of the related art, and it is possible to make an area smaller than the vibrator of the related art by the area of the base portion. Therefore, even if the area is the same as the vibrator of the related art, it is possible to make the length dimensions of the first circular or substantially circular arc-shaped beam portion and the second circular or substantially circular arc-shaped beam portion larger, and it is possible to decrease the resonant frequency of the in-plane vibration mode and the resonant frequency of the out-of-plane vibration mode.

In addition to this, the joining portion between the first circular or substantially circular arc-shaped beam portion and the second circular or substantially circular arc-shaped beam portion become the node of a vibration, and the base end-side weight portion is joined to that joining portion through the base end-side weight portion joining portion arranged so as to extend in the first axis direction. Therefore, the base end-side weight portion joining portion and the base end-side weight portion also become the node of a vibration. Accordingly, the area of a region defining the node of a vibration is increased, and hence, the support of the vibrator and the formation of a wiring line become easy. Furthermore, because of the base end-side weight portion, a mass is added to the joining portion between the first circular or substantially circular arc-shaped beam portion and the second circular or substantially circular arc-shaped beam portion. Therefore, it becomes difficult for the joining portion to vibrate, and it is possible to effectively prevent or significantly reduce the leakage of a vibration when the joining portion is supported.

It is preferred that the above-mentioned vibrator includes a first leading end-side weight portion and a second leading end-side weight portion. The first leading end-side weight portion is joined to the end portion of the first circular or substantially circular arc-shaped beam portion on the one side of the first axis direction. The second leading end-side weight portion is joined to the end portion of the second circular or substantially circular arc-shaped beam portion on the one side of the first axis direction.

In this configuration, since the first leading end-side weight portion and the second leading end-side weight portion add masses to the end portions of the first circular or substantially circular arc-shaped beam portion and the second circular or substantially circular arc-shaped beam portion on the one side of the first axis direction, it is possible to make a Coriolis force larger, the Coriolis force being applied to the vibrator vibrating in the in-plane vibration mode due to an angular velocity around the first axis.

It is preferred that the above-mentioned vibrator includes a supporting-portion joining portion and a supporting portion.

The supporting-portion joining portion extends from the joining portion between the first circular or substantially circular arc-shaped beam portion and the second circular or substantially circular arc-shaped beam portion in a direction opposite to the base end-side weight portion joining portion. The supporting portion is joined to the supporting-portion joining portion.

In addition, it is preferred that, in the above-mentioned vibrator, the supporting portion is disposed so as to surround the first circular or substantially circular arc-shaped beam portion and the second circular or substantially circular arc-shaped beam portion.

In these configurations, the supporting-portion joining portion and the supporting portion also become the node of a vibration. Accordingly, the area of a region defining the node of a vibration is increased, and hence, the support of the vibrator and the formation of a wiring line become easy. Furthermore, because of the supporting-portion joining portion and the supporting portion, a mass is added to the joining portion between the first circular or substantially circular arc-shaped beam portion and the second circular or substantially circular arc-shaped beam portion. Therefore, it becomes difficult for the joining portion to vibrate, and it is possible to further reduce or prevent the leakage of a vibration when the joining portion is supported.

It is preferred that the above-mentioned vibrator includes a leading end-side supporting portion. The leading end-side supporting portion extends, in the first axis direction, from an end portion of the base end-side weight portion in the first axis direction, and joined to the supporting portion.

In this configuration, since the base end-side weight portion is supported using the base end-side weight portion joining portion and the leading end-side supporting portion, the mechanical strength of a vibrating body is increased.

It is preferred that the above-mentioned supporting portion in the vibrator is configured so that an inner circumference follows the first circular or substantially circular arc-shaped beam portion and the second circular or substantially circular arc-shaped beam portion.

In addition, it is preferred that a dimension of the above-mentioned supporting portion in the vibrator in a third axis direction perpendicular or substantially perpendicular to a first axis and a second axis is larger than the first circular or substantially circular arc-shaped beam portion and the second circular or substantially circular arc-shaped beam portion.

In these configurations, since the mass of the supporting portion becomes large, it is possible to further suppress the leakage of a vibration from the supporting portion.

It is preferred that a vibrating gyroscope according to a preferred embodiment of the present invention includes the above-mentioned vibrator, a driving portion configured to drive the vibrator so that the vibrator vibrates in an in-plane vibration mode in which a distance between the end portions of the first circular or substantially circular arc-shaped beam portion and the second circular or substantially circular arc-shaped beam portion on the one side of the first axis direction changes, and a detecting portion configured to detect a vibration of an out-of-plane vibration mode in which the first circular or substantially circular arc-shaped beam portion and the second circular or substantially circular arc-shaped beam portion alternately bend in a third axis direction owing to a Coriolis force applied to the vibrator by an angular velocity around a first axis, the vibrator vibrating in the in-plane vibration mode.

In this configuration, it is possible to decrease the resonant frequency of the vibrator while a small vibrator is used, and it is possible to enhance a detection sensitivity for an angular velocity. Since the area of a region to be the node of a vibration in the vibrator is large, the support of the vibrator and the formation of a wiring line become easy. Furthermore, by supporting the vibrator using the region to be the node of a vibration, it is possible to prevent a vibration from leaking or prevent an undesired vibration from propagating from outside, and it is possible to enhance the detection sensitivity for the angular velocity.

It is preferred that the vibrator of the above-mentioned vibrating gyroscope includes a silicon substrate, and the driving portion and the detecting portion include a piezoelectric body film, a ground electrode, a driving electrode or a detection electrode.

In this preferred embodiment, a configuration is adopted where the vibrator is independent from the driving portion or the detecting portion. Accordingly, it is possible for the vibrator to have a shape to cause an ideal vibration mode, and it is possible to enhance the detection sensitivity for the angular velocity. In addition, in the vibrator, it is possible to realize high shape accuracy because of semiconductor microfabrication performed on the silicon substrate. In addition, it is possible to form the piezoelectric body film or the electrode using a thin-film microfabrication process.

It is preferred that the piezoelectric body film, the ground electrode, the driving electrode, and the detection electrode in the above-mentioned vibrating gyroscope are provided on only one surface of the vibrator.

By sequentially implementing a semiconductor microfabrication process and the thin-film microfabrication process, it is possible to realize this configuration, and it is possible to simplify a manufacture process.

It is preferred that the driving portion and the detecting portion in the above-mentioned vibrating gyroscope include a floating electrode. The driving electrode or the detection electrode is arranged to face the floating electrode across the piezoelectric body film.

In this configuration, by making an electric field applied to the piezoelectric body film larger, the deformation amount of the piezoelectric body film is enlarged, and hence, it is possible to enhance the detection sensitivity for the angular velocity. In addition, since it is not necessary to provide a wiring line connected to the floating electrode, it is not necessary to process the silicon substrate or the piezoelectric body film so as to provide the wiring line, and it is possible to simplify a manufacture process.

It is preferred that the driving electrode in the above-mentioned vibrating gyroscope includes a first driving electrode provided so as to face the ground electrode across the piezoelectric body film, and a second driving electrode that faces the ground electrode across the piezoelectric body film and is provided to be adjacent to the first driving electrode.

In this configuration, driving voltages whose polarities are opposite to each other are applied to the first driving electrode and the second driving electrode. Therefore, it is possible to double the intensity of an electric field applied to the piezoelectric body film, compared with a case where driving voltages having a single polarity are only applied. By changing the voltage polarities of the driving voltages applied to the first driving electrode and the second driving electrode, it is possible to change the direction of an electric field applied to the piezoelectric body film. Therefore, it is possible to easily realize the same deformation as in a case where the polarization direction of the piezoelectric body film is reversed.

According to various preferred embodiments of the present invention, it is possible to omit a base portion provided in a vibrator of the related art, and it is possible to make an area smaller than the vibrator of the related art by the area of the base portion. Even if the area is the same as the vibrator of the related art, it is possible to make the length dimensions of the first circular or substantially circular arc-shaped beam portion and the second circular or substantially circular arc-shaped beam portion larger, and it is possible to decrease the resonant frequency of the in-plane vibration mode and the resonant frequency of the out-of-plane vibration mode. Therefore, it is possible to realize a vibrating gyroscope whose detection sensitivity for an angular velocity is high. In addition to this, by providing the base end-side weight portion joining portion and the base end-side weight portion, the area of a region to be the node of a vibration is increased, and the support of the vibrator and the formation of a wiring line become easy in the vibrating gyroscope. In addition, by providing the base end-side weight portion joining portion and the base end-side weight portion, a mass is added to the joining portion between the first circular or substantially circular arc-shaped beam portion and the second circular or substantially circular arc-shaped beam portion. Therefore, it becomes difficult for the joining portion to vibrate, and it is possible to effectively prevent or significantly reduce the leakage of a vibration when the joining portion is supported.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following description, it is assumed that the rotation axis of a vibrating gyroscope is the X-axis of an orthogonal coordinate system, the drive axis of the vibrating gyroscope is a Y-axis, and the detection axis of the vibrating gyroscope is a Z-axis.

First Preferred Embodiment

Figure 1A:
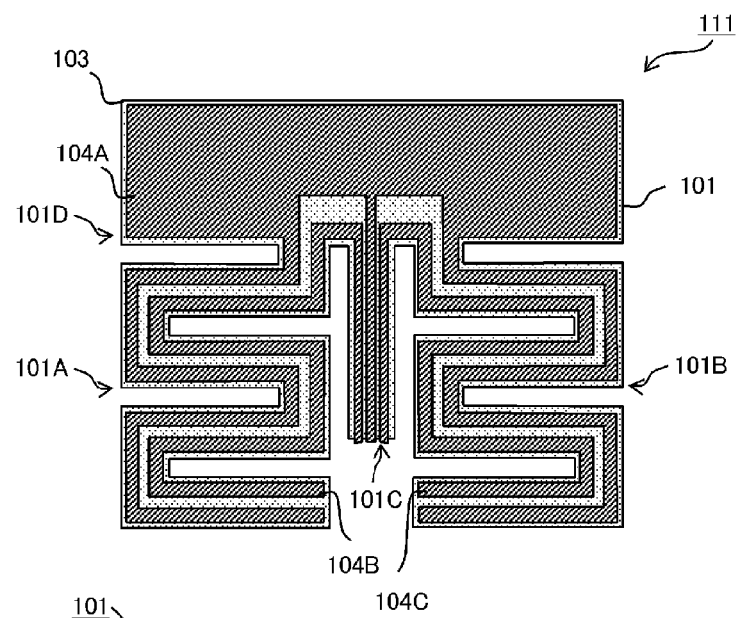
FIGS. 1A and 1B are diagrams explaining a configuration of a vibrating gyroscope including a vibrator of the related art.
Figure 1B:
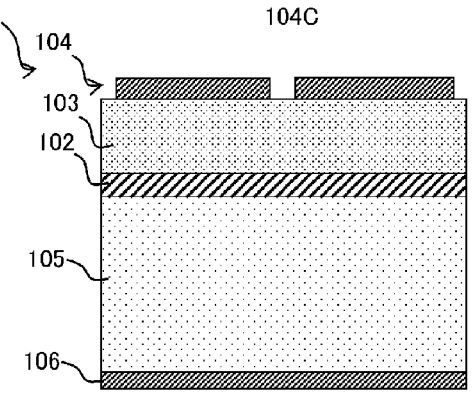
Figure 2:
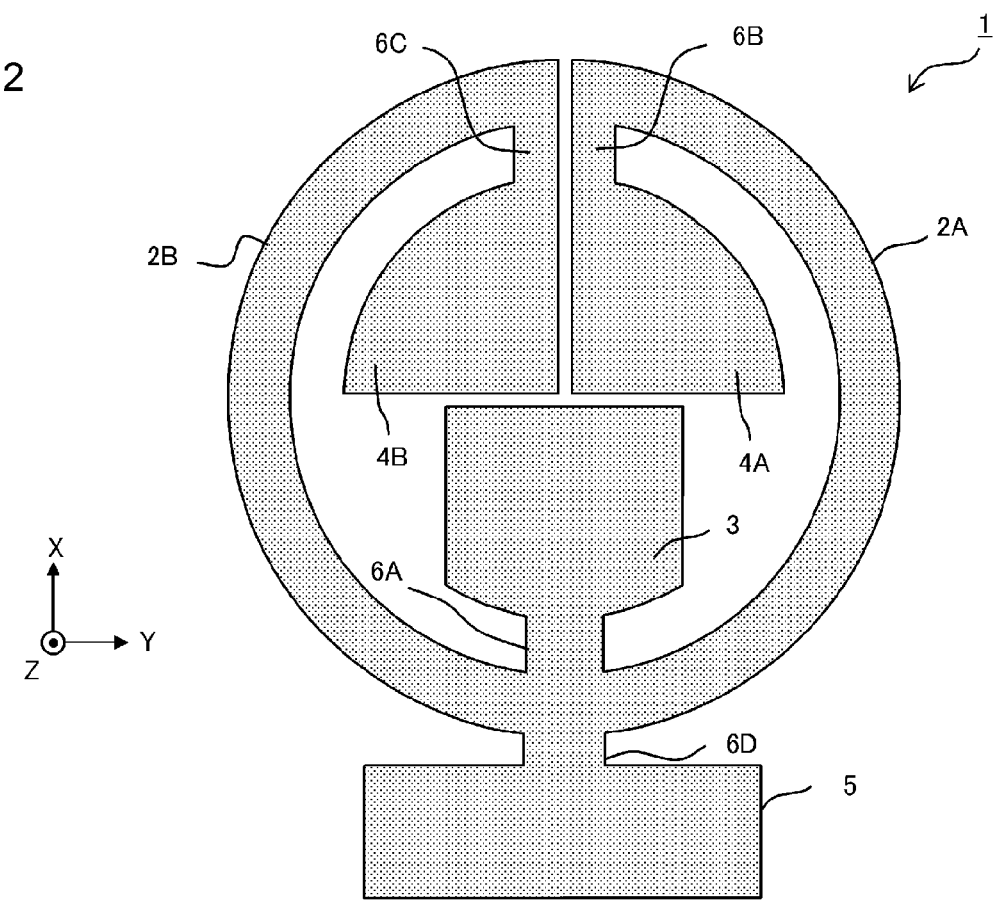
FIG. 2 is a diagram explaining a configuration of a vibrator according to a first preferred embodiment of the present invention.

FIG. 2 is the plan view (X-Y plane plan view) of a vibrator 1 according to a first preferred embodiment of the present invention.

The vibrator 1 includes a silicon substrate. The vibrator 1 includes a first circular or substantially circular arc-shaped beam portion 2A, a second circular or substantially circular arc-shaped beam portion 2B, a base end-side weight portion 3, a first leading end-side weight portion 4A, a second leading end-side weight portion 4B, a supporting portion 5, and joining portions 6A to 6D. Since the vibrator 1 is preferably formed using a semiconductor microfabrication technique, shape symmetry is very high with the X-axis of the vibrator 1 in an X-Y plane serving as a symmetric axis.

Each of the first and second circular or substantially circular arc-shaped beam portions 2A and 2B is a circular or substantially circular arc-shaped cantilever beam in planar view. The first and second circular or substantially circular arc-shaped beam portions 2A and 2B are joined to each other in end portions (hereinafter, referred to as lower ends) in an X-axis negative direction, and define a ring-shaped member including an aperture portion. The individual end portions (hereinafter, referred to as upper ends) of the first circular or substantially circular arc-shaped beam portion 2A and the second circular or substantially circular arc-shaped beam portion 2B in an X-axis positive direction face each other across a distance in a Y-axis direction, and the corresponding distance defines the aperture portion of the ring-shaped member.

The base end-side weight portion 3 preferably has a roughly rectangular shape where one side on a lower end side has a circular or substantially circular arc shape in planar view. The base end-side weight portion 3 is disposed between the first circular arc-shaped beam portion 2A and the second circular arc-shaped beam portion 2B. In other words, the base end-side weight portion 3 is disposed within the ring-shaped member including the first and second circular or substantially circular arc-shaped beam portions 2A and 2B. The lower end side of the base end-side weight portion 3 is joined to a joining portion between the first circular or substantially circular arc-shaped beam portion 2A and the second circular or substantially circular arc-shaped beam portion 2B through the joining portion 6A.

Each of the first and second leading end-side weight portions 4A and 4B preferably has a sector shape in planar view. The first and second leading end-side weight portions 4A and 4B are disposed between the first circular or substantially circular arc-shaped beam portion 2A and the second circular or substantially circular arc-shaped beam portion 2B. In other words, the first and second leading end-side weight portions 4A and 4B are disposed within the ring-shaped member including the first and second circular or substantially circular arc-shaped beam portions 2A and 2B. The upper end side of the first leading end-side weight portion 4A is joined to the upper end of the first circular or substantially circular arc-shaped beam portion 2A through the joining portion 6B. The upper end side of the second leading end-side weight portion 4B is joined to the upper end of the second circular or substantially circular arc-shaped beam portion 2B through the joining portion 6C.

The supporting portion 5 preferably has a rectangular or substantially rectangular shape in planar view. The supporting portion 5 is disposed so as to face the base end-side weight portion 3 across the joining portion between the first circular or substantially circular arc-shaped beam portion 2A and the second circular or substantially circular arc-shaped beam portion 2B. In other words, the supporting portion 5 is disposed in the outer side portion of the ring-shaped member including the first and second circular or substantially circular arc-shaped beam portions 2A and 2B. The upper end side of the supporting portion 5 is joined to the joining portion between the first circular or substantially circular arc-shaped beam portion 2A and the second circular or substantially circular arc-shaped beam portion 2B through the joining portion 6D. The first and second circular or substantially circular arc-shaped beam portions 2A and 2B are supported by the supporting portion 5 so as to be capable of vibrating. The joining portion 6A is a base end-side weight portion joining portion. The joining portion 6B is a leading end-side weight portion joining portion. The joining portion 6C is a leading end-side weight portion joining portion. The joining portion 6D is a supporting-portion joining portion.

Figure 3A:
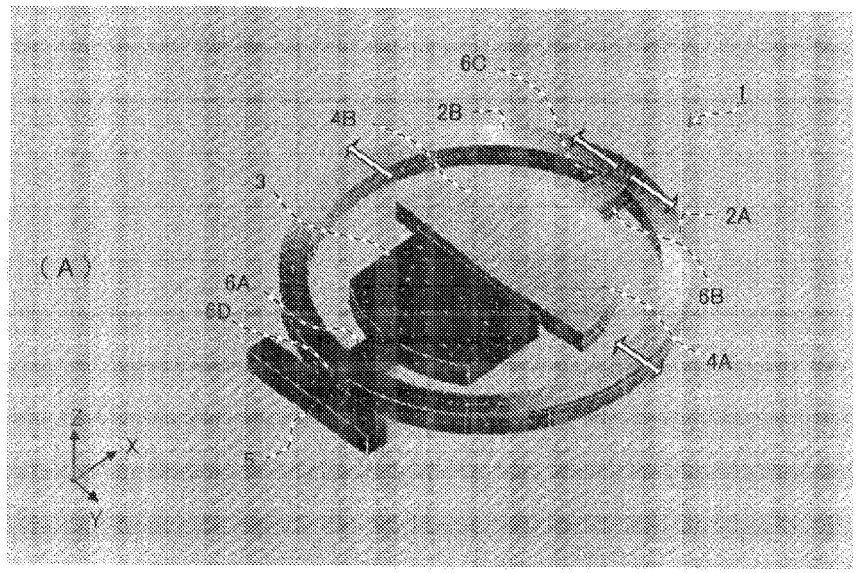
FIGS. 3A and 3B are diagrams explaining a vibration mode of the vibrator according to the first preferred embodiment of the present invention.

FIG. 3A is a diagram explaining the in-plane vibration mode of the vibrator 1. The in-plane vibration mode of the vibrator 1 is a vibration mode where the vibrator 1 vibrates within the main surface (X-Y plane) of the vibrator 1 with an axis as a symmetric axis, the axis passing through the centers of the joining portions 6A and 6D and being parallel to the X-axis. In the in-plane vibration mode of the vibrator 1, the vibrator 1 vibrates in such a manner that distances between the upper end side of the first circular or substantially circular arc-shaped beam portion 2A and the first leading end-side weight portion 4A and the upper end side of the second circular or substantially circular arc-shaped beam portion 2B and the second leading end-side weight portion 4B change. The lower end sides of the first and second circular or substantially circular arc-shaped beam portions 2A and 2B, the base end-side weight portion 3, the supporting portion 5, and the joining portions 6A and 6D become the node of the vibration. In more detail, a vibration occurs line-symmetrically with respect to the symmetric axis in such a manner that the upper end side of the first circular or substantially circular arc-shaped beam portion 2A and the first leading end-side weight portion 4A reciprocate and the upper end side of the second circular arc-shaped beam portion 2B and the second leading end-side weight portion 4B reciprocate, along the Y-axis.

Figure 3B:
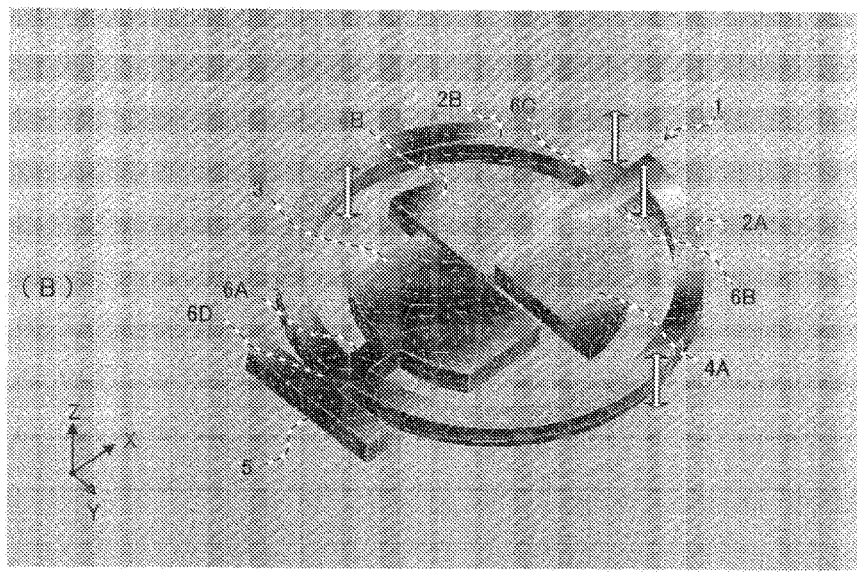

FIG. 3B is a diagram explaining the out-of-plane vibration mode of the vibrator 1. The out-of-plane vibration mode of the vibrator 1 is a vibration mode where the vibrator 1 vibrates outside the main surface (X-Y plane) of the vibrator 1 with an axis as a symmetric axis, the axis passing through the centers of the joining portions 6A and 6D and being parallel to the X-axis. In the out-of-plane vibration mode of the vibrator 1, the vibrator 1 vibrates in such a manner that the upper end side of the first circular or substantially circular arc-shaped beam portion 2A and the first leading end-side weight portion 4A and the upper end side of the second circular or substantially circular arc-shaped beam portion 2B and the second leading end-side weight portion 4B alternately bend along the Z-axis. A region in the vicinity of an axis passing through the centers of the joining portions 6A and 6D and being parallel to the X-axis becomes the node of a vibration, the region including the lower end sides of the first and second circular or substantially circular arc-shaped beam portions 2A and 2B, the base end-side weight portion 3, the supporting portion 5, and the joining portions 6A and 6D. In more detail, a vibration occurs line-symmetrically with respect to the symmetric axis in such a manner that the upper end side of the first circular or substantially circular arc-shaped beam portion 2A and the first leading end-side weight portion 4A reciprocate and the upper end side of the second circular or substantially circular arc-shaped beam portion 2B and the second leading end-side weight portion 4B reciprocate, along the Z-axis.

The vibration directions of the first circular or substantially circular arc-shaped beam portion 2A and the first leading end-side weight portion 4A in the above-mentioned in-plane vibration mode are out of phase with the vibration directions thereof in the out-of-plane vibration mode by 90 degrees, the vibration directions of the second circular or substantially circular arc-shaped beam portion 2B and the second leading end-side weight portion 4B in the above-mentioned in-plane vibration mode are out of phase with the vibration directions thereof in the out-of-plane vibration mode by 90 degrees. Accordingly, by causing the resonant frequencies of these in the in-plane vibration mode and the out-of-plane vibration mode to roughly coincide with each other, it is possible to utilize these vibration modes as the drive vibration mode and the detection vibration mode in the vibrating gyroscope.

Figure 4A:
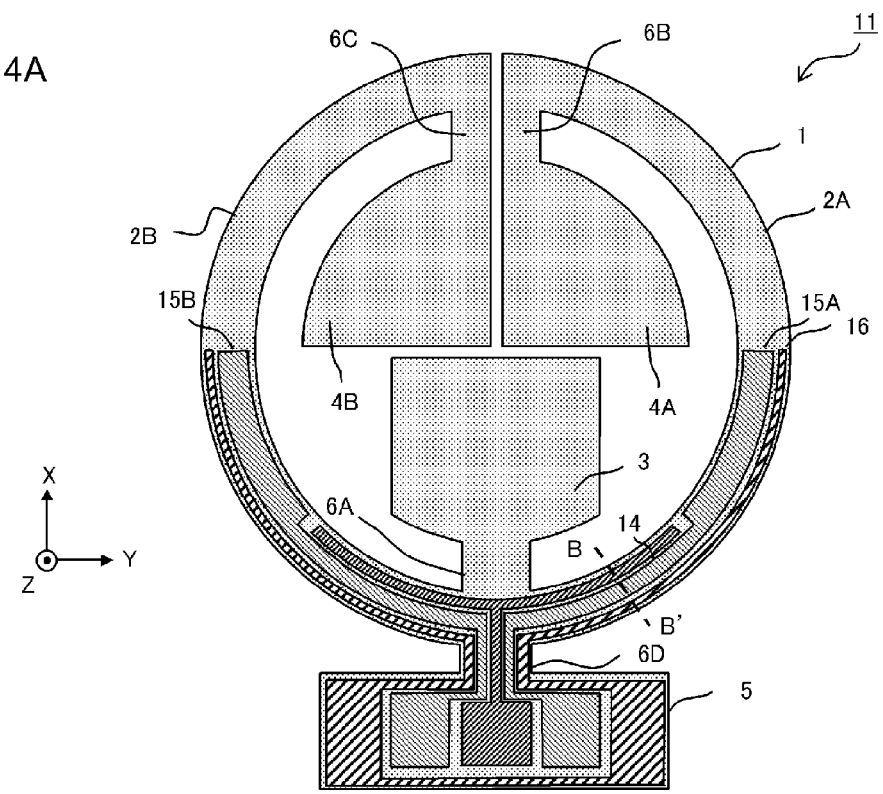
FIGS. 4A and 4B are diagrams explaining a configuration of a vibrating gyroscope according to the first preferred embodiment of the present invention.
Figure 4B:
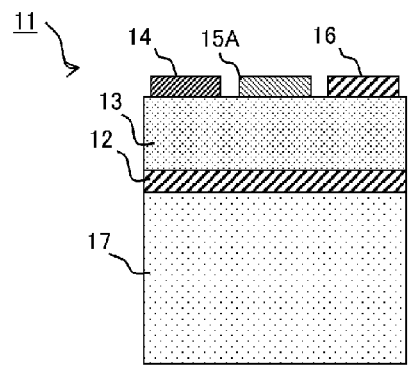

Next, an example of the configuration of a vibrating gyroscope 11 utilizing the vibrator 1 according to the first preferred embodiment will be described. FIG. 4A is the plan view (X-Y plane plan view) of the vibrating gyroscope 11. FIG. 4B is the partially enlarged cross-sectional view of the vibrating gyroscope 11 at a position illustrated by B-B' within FIG. 4A. The vibrating gyroscope 11 includes the vibrator 1, a floating electrode 12, a piezoelectric body film 13, a driving electrode 14, detection electrodes 15A and 15B, a ground electrode 16, and a substrate 17.

The floating electrode 12 is provided in the top surface of the substrate 17. The piezoelectric body film 13 is a thin film including one of piezoelectric materials such as aluminum nitride, PZT, potassium sodium niobate, and zinc oxide, and provided so as to cover the floating electrode 12 and the substrate 17. The driving electrode 14, the detection electrodes 15A and 15B, and the ground electrode 16 are provided in the top surface of the piezoelectric body film 13. The substrate 17 includes a silicon substrate.

The driving electrode 14 preferably extends in a line shape from a pad, used for an external connection and provided in the supporting portion 5, to the joining portion 6D, the joining portion between the first circular or substantially circular arc-shaped beam portion 2A and the second circular or substantially circular arc-shaped beam portion 2B, and the first and second circular or substantially circular arc-shaped beam portions 2A and 2B. The detection electrode 15A is provided so as to extend in a line shape from a pad, used for an external connection and provided in the supporting portion 5, to the joining portion 6D, the joining portion between the first circular or substantially circular arc-shaped beam portion 2A and the second circular or substantially circular arc-shaped beam portion 2B, and the first circular arc-shaped beam portion 2A. The detection electrode 15B preferably extends in a line shape from a pad, used for an external connection and provided in the supporting portion 5, to the joining portion 6D, the joining portion between the first circular or substantially circular arc-shaped beam portion 2A and the second circular or substantially circular arc-shaped beam portion 2B, and the second circular or substantially circular arc-shaped beam portion 2B.

The ground electrode 16 preferably extends in a line shape from two pads, used for an external connection, connected to each other, and provided in the supporting portion 5, to the joining portion 6D, the joining portion between the first circular or substantially circular arc-shaped beam portion 2A and the second circular or substantially circular arc-shaped beam portion 2B, and the first and second circular or substantially circular arc-shaped beam portions 2A and 2B.

In collaboration with the floating electrode 12, the piezoelectric body film 13, and the ground electrode 16, the driving electrode 14 configures an electromechanical conversion element functioning as a driving portion. In collaboration with the floating electrode 12, the piezoelectric body film 13, and the ground electrodes 16, the detection electrodes 15A and 15B configure an electromechanical conversion element functioning as a detecting portion.

The driving electrode 14 is provided on an inner circumference side in the main surfaces of the first and second circular arc-shaped beam portions 2A and 2B, compared with the detection electrodes 15A and 15B and the ground electrode 16. Therefore, when an alternating voltage is applied to the driving electrode 14, the vibrator 1 vibrates in the in-plane vibration mode illustrated in FIG. 3A. In other words, the vibrating gyroscope 11 uses the in-plane vibration mode of the vibrator 1 as the drive vibration mode.

In the vibrating gyroscope 11, when an angular velocity around the X-axis serving as a rotation axis is applied to the vibrator 1 in a state in which the vibrator 1 vibrates in the drive vibration mode, a Coriolis force is applied in a direction perpendicular or substantially perpendicular to the rotation axis and a vibration direction in the drive vibration mode of the vibrator 1. Because of the Coriolis force, the vibrator 1 vibrates in the out-of-plane vibration mode illustrated in FIG. 3B. In other words, the vibrating gyroscope 11 utilizes the out-of-plane vibration mode of the vibrator 1 as the detection vibration mode. The vibration of the detection vibration mode has an amplitude according to the magnitude of the angular velocity applied to the vibrator 1, in other words, the magnitude of the Coriolis force occurring due to the angular velocity. Then, a vibration occurs in such a manner that when the upper end side of the first circular or substantially circular arc-shaped beam portion 2A and the first leading end-side weight portion 4A move to one side of the Z-axis with an axis as a symmetric axis, the axis passing through the centers of the joining portions 6A and 6D and being parallel or substantially parallel to the X-axis, the upper end side of the second circular or substantially circular arc-shaped beam portion 2B and the second leading end-side weight portion 4B move to the other side of the Z-axis, and in a contrasting situation, when the upper end side of the first circular or substantially circular arc-shaped beam portion 2A and the first leading end-side weight portion 4A move to the other side of the Z-axis, the upper end side of the second circular or substantially circular arc-shaped beam portion 2B and the second leading end-side weight portion 4B move to the one side of the Z-axis. In other words, the first circular or substantially circular arc-shaped beam portion 2A and the second circular or substantially circular arc-shaped beam portion 2B vibrate so that the displacements thereof in the Z-axis direction become anti-symmetric with respect to the X-Y plane, and detected voltages whose phases are opposite to each other occur in the detection electrodes 15A and 15B. When the detected voltages occurring in the individual detection electrodes 15A and 15B are subjected to differential amplification in a circuit located at a subsequent stage, the detected voltages whose phases are opposite to each other are added. Accordingly, it is possible to configure a detection circuit so as to obtain an output corresponding to the amplitude of a vibration due to the detection vibration mode.

In addition, the detection electrode 15A is provided in the top surface of the first circular arc-shaped beam portion 2A. The detection electrode 15B is provided in the top surface of the second circular or substantially circular arc-shaped beam portion 2B. Therefore, when the vibrator 1 vibrates in the in-plane vibration mode serving as the drive vibration mode, illustrated in FIG. 3A, a vibration occurs in such a manner that when the upper end side of the first circular or substantially circular arc-shaped beam portion 2A and the first leading end-side weight portion 4A move away from an axis serving as a symmetric axis, the symmetric axis passing through the centers of the joining portions 6A and 6D and being parallel or substantially parallel to the X-axis, the upper end side of the second circular or substantially circular arc-shaped beam portion 2B and the second leading end-side weight portion 4B also move away from the symmetric axis, and in a contrasting situation, when the upper end side of the first circular or substantially circular arc-shaped beam portion 2A and the first leading end-side weight portion 4A come close to the symmetric axis, the upper end side of the second circular or substantially circular arc-shaped beam portion 2B and the second leading end-side weight portion 4B also come close to the symmetric axis. In other words, the first circular or substantially circular arc-shaped beam portion 2A and the second circular or substantially circular arc-shaped beam portion 2B vibrate line-symmetrically with respect to the symmetric axis, and detected voltages whose phases are equal to each other occur in the detection electrodes 15A and 15B. When the detected voltages occurring in the individual detection electrodes 15A and 15B are subjected to differential amplification in a circuit located at a subsequent stage, the detected voltages whose phases are equal to each other cancel each other out. Accordingly, it is possible to configure a detection circuit so as not to detect the vibration of the drive vibration mode.

As described above, in the vibrating gyroscope 11 of the present preferred embodiment, since the first and second circular or substantially circular arc-shaped beam portions 2A and 2B preferably have circular or substantially circular arc shapes, it is possible to make the lengths of the first and second circular or substantially circular arc-shaped beam portions 2A and 2B longer than the dimension of the vibrator 1 in an X-axis direction. Accordingly, it is possible to make the vibrator 1 smaller while the resonant frequencies of the drive vibration mode and detection vibration mode described above are prevented from becoming high. In addition, by joining the lower ends of the first and second circular or substantially circular arc-shaped beam portions 2A and 2B to each other, it is possible for such a configuration as the base portion described in International Publication No. WO2008/010336 to be rendered unnecessary, and this point also contributes to making the vibrator 1 smaller.

Since the first leading end-side weight portion 4A is provided on the upper end side of the first circular or substantially circular arc-shaped beam portion 2A and the second leading end-side weight portion 4B is provided on the upper end side of the second circular or substantially circular arc-shaped beam portion 2B, the Coriolis force is made larger that occurs when the angular velocity around the X-axis serving as the rotation axis is applied to the vibrator 1 in a state in which the vibrator 1 vibrates in the above-mentioned drive vibration mode, and hence, it is possible to make the vibration amplitudes of the first circular or substantially circular arc-shaped beam portion 2A and the second circular or substantially circular arc-shaped beam portion 2B larger.

In addition, in the vibrating gyroscope 11, in any vibration mode of the drive vibration mode and the detection vibration mode, the joining portion between the first circular or substantially circular arc-shaped beam portion 2A and the second circular or substantially circular arc-shaped beam portion 2B, the base end-side weight portion 3, the supporting portion 5, and the joining portions 6A and 6D become each node of vibrations, and the positions of these nodes coincide with each other in the drive vibration mode and the detection vibration mode. Accordingly, by supporting the vibrating gyroscope 11 using these nodes, it is possible to prevent a vibration from leaking through a supporting member or a wiring member in the vibrator 1 or prevent an undesired vibration from propagating from outside. In addition, by causing a joint portion with a member such as the supporting member or the wiring member to be the node of a vibration, the member including a material different from the vibrator 1, it is possible to prevent the drift of a detection sensitivity for an angular velocity from occurring due to the thermal stress of the supporting member, the wiring member, or the like. In addition, since the base end-side weight portion 3 and the supporting portion 5 are joined to the joining portion between the first circular or substantially circular arc-shaped beam portion 2A and the second circular or substantially circular arc-shaped beam portion 2B through the joining portions 6A and 6D, it is possible to add a mass to the joining portion between the first circular or substantially circular arc-shaped beam portion 2A and the second circular or substantially circular arc-shaped beam portion 2B. By adding the mass, it becomes difficult for the joining portion between the first circular or substantially circular arc-shaped beam portion 2A and the second circular or substantially circular arc-shaped beam portion 2B to vibrate, and when the joining portion is supported, it is possible to effectively prevent or significantly reduce the leakage of a vibration or the occurrence of the drift of the detection sensitivity.

In addition, the vibrator 1 preferably is integrally formed from the silicon substrate, and an electromechanical conversion element is configured by the piezoelectric body film 13 and the electrodes 12, 14, 15A, 15B, and 16. Therefore, it is possible to manufacture the vibrating gyroscope 11 using a semiconductor microfabrication process for a vibrator and a thin-film microfabrication process for an electrode and a piezoelectric body film. Accordingly, it is possible to make shape accuracy very high. In addition, by providing the floating electrode 12 between the piezoelectric body film 13 and the substrate 17, it is possible to make an electric field applied to the piezoelectric body film 13 larger than a case in which the floating electrode 12 is not provided, and it is possible to enlarge the deformation of the piezoelectric body film 13. In addition, it is not necessary to wire the floating electrode 12 by providing a via hole or the like in the vibrator 1, and it is possible to vibrate the vibrator 1 in an ideal vibration mode.

Second Preferred Embodiment

Next, a vibrating gyroscope 21 according to a second preferred embodiment of the present invention will be described.

Figure 5:
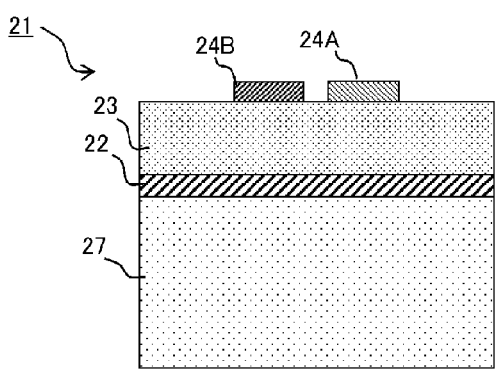
FIG. 5 is a diagram explaining a configuration of a vibrating gyroscope according to a second preferred embodiment of the present invention.

FIG. 5 is the partially enlarged cross-sectional view of the vibrating gyroscope 21 according to the present preferred embodiment. The vibrating gyroscope 21 has a configuration including an electrode structure that is different from the vibrating gyroscope 11 according to the first preferred embodiment.

The vibrating gyroscope 21 includes a ground electrode 22, a piezoelectric body film 23, a first driving electrode 24A, a second driving electrode 24B, and a substrate 27. The ground electrode 22 is disposed between the piezoelectric body film 23 and the substrate 27. The ground electrode 22 is obtained by connecting the floating electrode 12 of the first preferred embodiment to a ground. The first driving electrode 24A and the second driving electrode 24B are arranged to face the ground electrode 22 across the piezoelectric body film 23. Driving voltages whose phases are opposite to each other are applied to the first driving electrode 24A and the second driving electrode 24B. If such an electrode structure is adopted, even in the case of the same driving voltages as in the electrode structure illustrated in the first preferred embodiment, it is possible to double the intensity of an electric field applied to the piezoelectric body film 23, and it is possible to further enlarge the vibration amplitude of the vibrator 1.

Third Preferred Embodiment

Figure 6A:
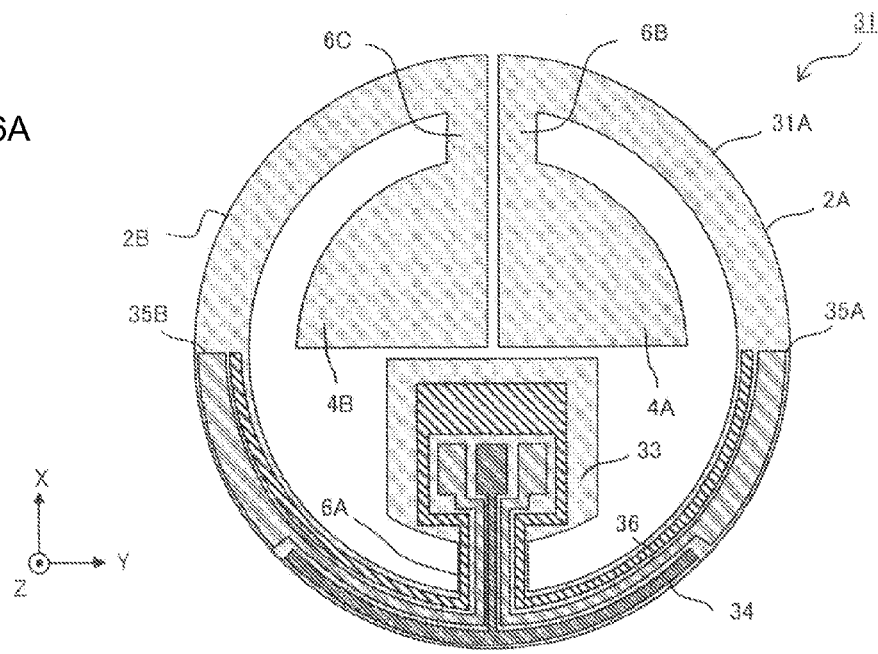
FIGS. 6A and 6B are diagrams explaining a configuration of a vibrating gyroscope according to a third preferred embodiment of the present invention.
Figure 6B:
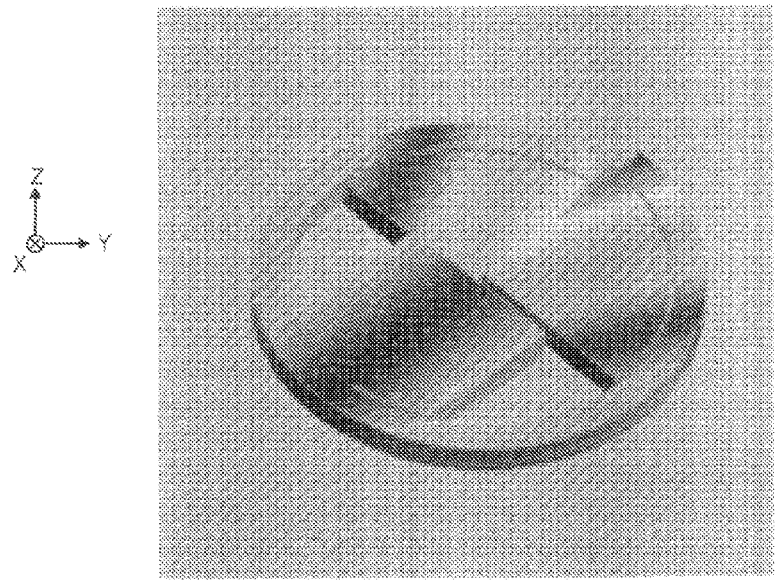

Next, a vibrating gyroscope 31 according to a third preferred embodiment of the present invention will be described. FIG. 6A is the plan view (X-Y plane plan view) of the vibrating gyroscope 31. FIG. 6B is the perspective view of the vibrating gyroscope 31 vibrating in an out-of-plane vibration mode.

The vibrating gyroscope 31 includes a vibrator 31A having a configuration in which the supporting portion 5 is omitted from the configuration of the vibrator 1 illustrated in the first preferred embodiment, and has a configuration including a driving electrode 34 where a pad used for an external connection is provided in a base end-side weight portion 33, detection electrodes 35A and 35B, and a ground electrode 36. In this configuration, since the base end-side weight portion 33 doubles as the function of the supporting portion 5 in the first preferred embodiment, it is possible to make the vibrator 31A even smaller.

In addition, in the vibrator 31A, since no supporting portion is provided, a mass added to the joining portion between the first circular or substantially circular arc-shaped beam portion 2A and the second circular or substantially circular arc-shaped beam portion 2B becomes smaller than the vibrator 1 in the first preferred embodiment. Accordingly, in the out-of-plane vibration mode in the first preferred embodiment illustrated in FIG. 3B, the area of a region to be the node of a vibration is larger than in the out-of-plane vibration mode in the third preferred embodiment illustrated in FIG. 6B, and the leakage of a vibration from the supporting member or the wiring member becomes smaller.

Fourth Preferred Embodiment

Figure 7A:
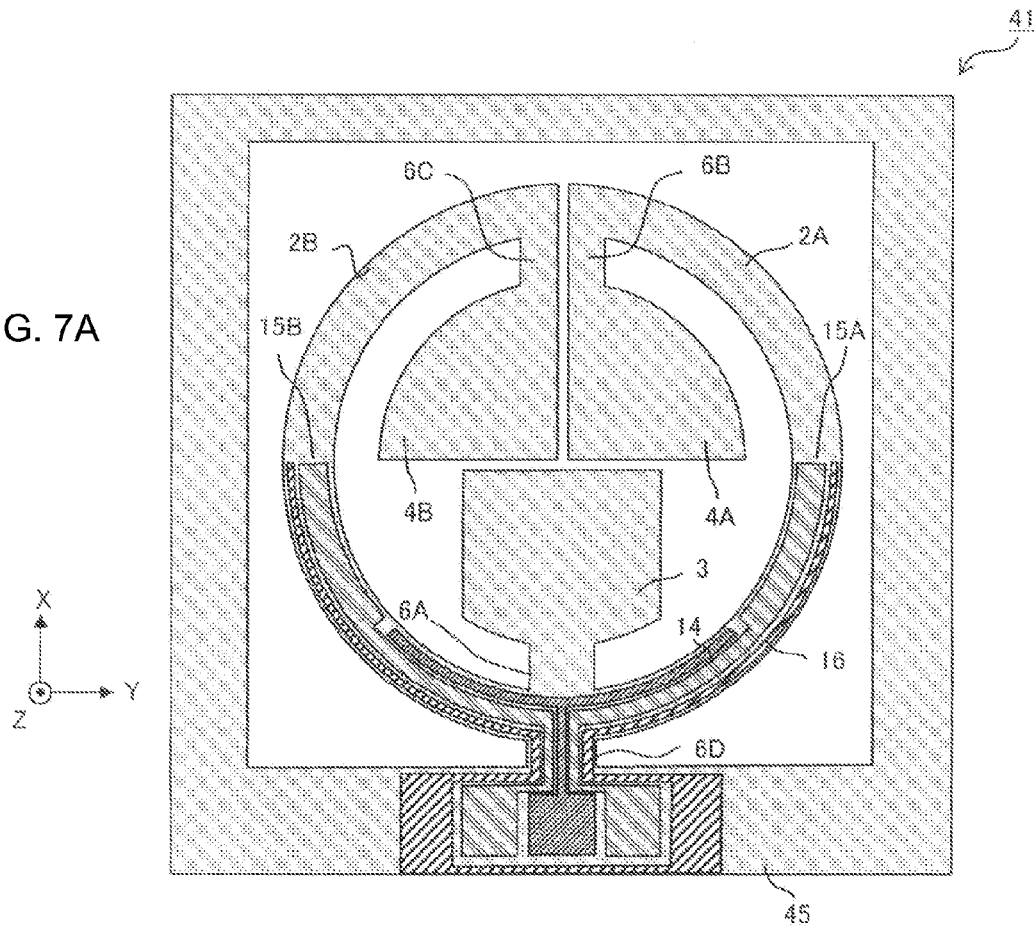
FIGS. 7A and 7B are diagrams explaining a configuration of a vibrating gyroscope according to a fourth preferred embodiment of the present invention.
Figure 7B:
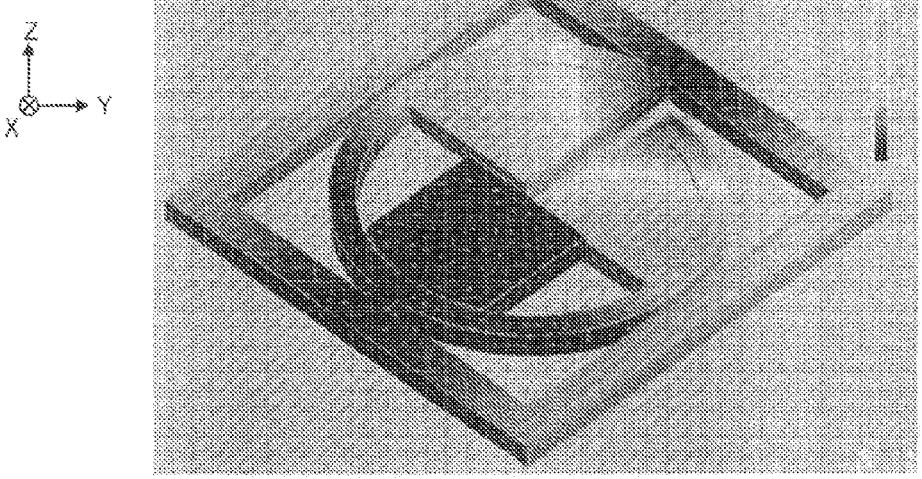

Next, a vibrating gyroscope 41 according to a fourth preferred embodiment of the present invention will be described. FIG. 7A is the plan view (X-Y plane plan view) of the vibrating gyroscope 41. FIG. 7B is the perspective view of the vibrating gyroscope 41 vibrating in an out-of-plane vibration mode.

The vibrating gyroscope 41 has a configuration in which a supporting portion 45 is provided in place of the supporting portion 5 in the vibrator 1 illustrated in the first preferred embodiment. The supporting portion 45 is a rectangular or substantially rectangular frame body, in which a rectangular or substantially rectangular aperture is provided, and disposed so as to surround the first and second circular or substantially circular arc-shaped beam portions 2A and 2B.

In the out-of-plane vibration mode, a torsional vibration also occurs in the supporting portion 5 in the first preferred embodiment or the supporting portion 45 in the present preferred embodiment. In this regard, however, in the present preferred embodiment, in addition to a region in the vicinity of an axis passing through the centers of the joining portions 6A and 6D and being parallel or substantially parallel to the X-axis, the region including the lower end sides of the first and second circular arc-shaped beam portions 2A and 2B, the base end-side weight portion 3, and the joining portions 6A and 6D, a side on the upper end side of the supporting portion 45 and a side on the lower end side thereof also become the nodes of a vibration. The supporting portion 45 adds a mass to the joining portion between the first circular or substantially circular arc-shaped beam portion 2A and the second circular or substantially circular arc-shaped beam portion 2B. Therefore, in the present preferred embodiment, the mass added to the joining portion between the first circular or substantially circular arc-shaped beam portion 2A and the second circular or substantially circular arc-shaped beam portion 2B becomes larger than in the vibrator 1 in the first preferred embodiment or the vibrator 31A in the third preferred embodiment. Accordingly, in the out-of-plane vibration mode in the fourth preferred embodiment illustrated in FIG. 7B, the area of a region to be the node of a vibration is larger than in the out-of-plane vibration mode in the first preferred embodiment illustrated in FIG. 3B or in the out-of-plane vibration mode in the third preferred embodiment illustrated in FIG. 6B, and the leakage of a vibration from the supporting member or the wiring member becomes smaller.

Accordingly, in this configuration, it is easy to support the vibrator or perform wiring, using the region to be the node of a vibration, and it is possible to prevent a vibration from leaking through a supporting member or a wiring member or prevent the drift of the detection sensitivity from occurring.

Fifth Preferred Embodiment

Figure 8:
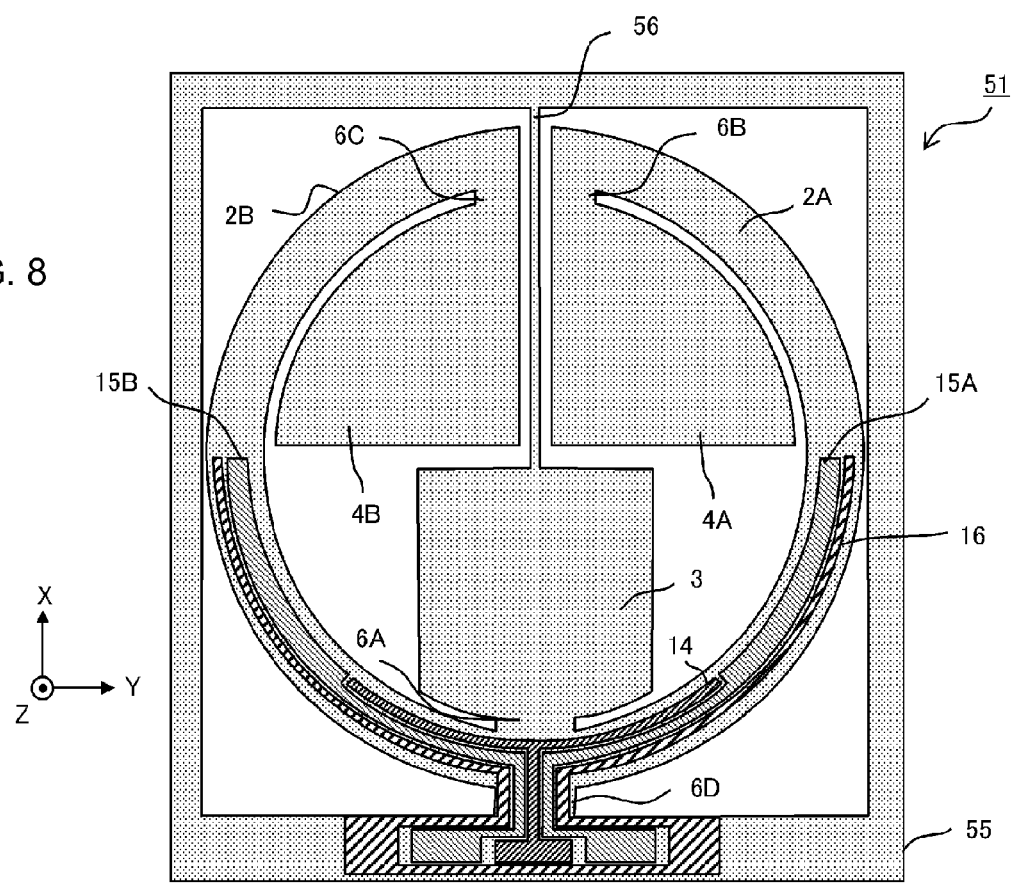
FIG. 8 is a diagram explaining a configuration of a vibrating gyroscope according to a fifth preferred embodiment of the present invention.

Next, a vibrating gyroscope 51 according to a fifth preferred embodiment of the present invention will be described. FIG. 8 is the plan view (X-Y plane plan view) of the vibrating gyroscope 51.

The vibrating gyroscope 51 adopts a configuration where, in the configuration of the vibrator 1 illustrated in the first preferred embodiment, a supporting portion 55 is provided in place of the supporting portion 5 and a joining portion 56 is further provided that establishes joining between the base end-side weight portion 3 and the supporting portion 55. The supporting portion 55 is a rectangular or substantially rectangular frame body, in which a rectangular or substantially rectangular aperture is provided, and disposed so as to surround the first and second circular or substantially circular arc-shaped beam portions 2A and 2B. The joining portion 56 is a leading end-side supporting portion, and disposed on an axis that passes through the centers of the joining portions 6A and 6D and is parallel or substantially parallel to the X-axis. Therefore, the joining portion 56 also defines the node of a vibration.

In this configuration, in the same way as the fourth preferred embodiment, the leakage of a vibration from a supporting member or a wiring member becomes small. Furthermore, in this configuration, it is possible to enhance the mechanical strength of the vibrating gyroscope 51. Specifically, since the base end-side weight portion 3 is joined to the supporting portion 55 due to the joining portion 56, the base end-side weight portion 3 is not highly deformed when some kind of impact load has acted on the vibrating gyroscope 51. Accordingly, the vibrating gyroscope 51 has high impact resistance.

Sixth Preferred Embodiment

Figure 9:
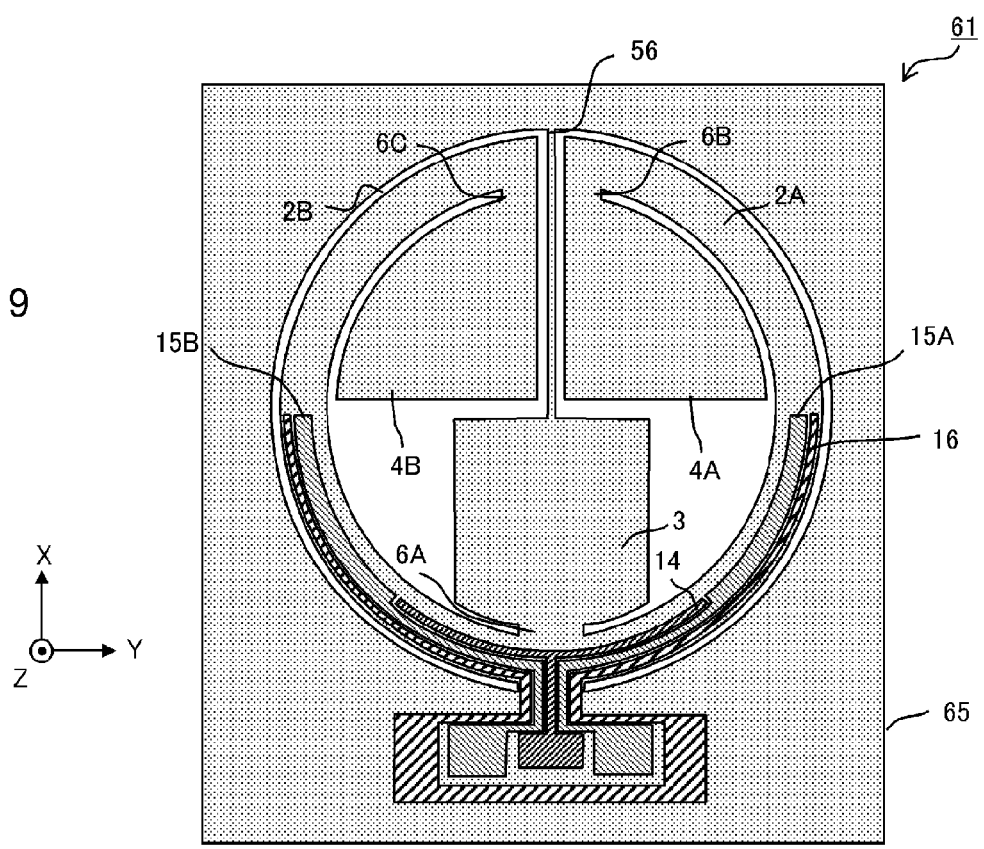
FIG. 9 is a diagram explaining a configuration of a vibrating gyroscope according to a sixth preferred embodiment of the present invention.

Next, a vibrating gyroscope 61 according to a sixth preferred embodiment of the present invention will be described. FIG. 9 is the plan view (X-Y plane plan view) of the vibrating gyroscope 61.

The vibrating gyroscope 61 adopts a configuration including a supporting portion 65 in which a circular or substantially circular aperture is provided, in place of the supporting portion 55 illustrated in the fifth preferred embodiment. The supporting portion 65 is a rectangular or substantially rectangular frame body in which the circular or substantially circular aperture is provided. The supporting portion 65 is configured so that the inner circumference of the aperture follows the first and second circular or substantially circular arc-shaped beam portions 2A and 2B. In this configuration, by decreasing distances between the first and second circular or substantially circular arc-shaped beam portions 2A and 2B and the supporting portion 65, a percentage of an entire mass the supporting portion 65 accounts for is made larger, and hence, it is possible to further enlarge the mass added to the joining portion between the first circular or substantially circular arc-shaped beam portion 2A and the second circular or substantially circular arc-shaped beam portion 2B. Accordingly, the area of the region to be the node of a vibration is made larger, and it is possible to make the leakage of a vibration from the supporting member or the wiring member smaller.

Seventh Preferred Embodiment

Figure 10:
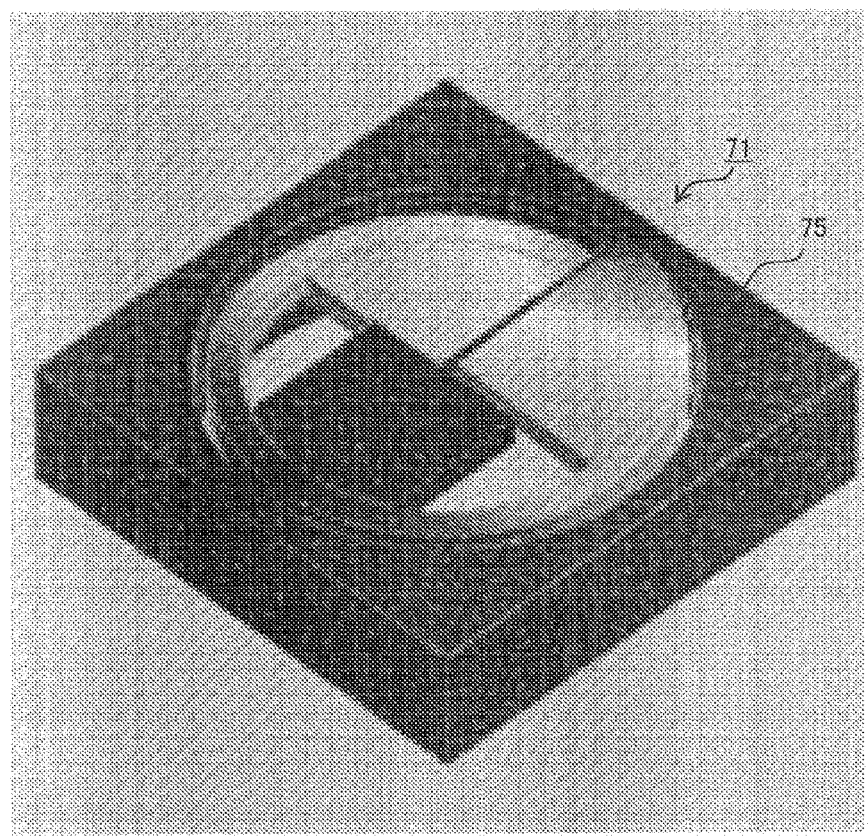
FIG. 10 is a diagram explaining a configuration of a vibrating gyroscope according to a seventh preferred embodiment of the present invention.

Next, a vibrating gyroscope 71 according to a seventh preferred embodiment of the present invention will be described. FIG. 10 is the perspective view of the vibrating gyroscope 71 vibrating in an out-of-plane vibration mode.

This vibrating gyroscope 71 adopts a configuration including a supporting portion 75 where a dimension in the Z-axis direction in the supporting portion 65 in which the circular or substantially circular aperture illustrated in the sixth preferred embodiment is provided is made larger. Specifically, the dimension of the supporting portion 75 in the Z-axis direction is larger than the first and second circular or substantially circular arc-shaped beam portions 2A and 2B. In this configuration, by making the dimension of the supporting portion 75 in the Z-axis direction larger, a mass in the entire mass the supporting portion 75 accounts for is made even larger, and hence, it is possible to further enlarge the mass added to the joining portion between the first circular or substantially circular arc-shaped beam portion 2A and the second circular or substantially circular arc-shaped beam portion 2B. Accordingly, the area of the region to be the node of a vibration is made larger, and it is possible to make the leakage of a vibration from the supporting member or the wiring member smaller.

Eighth Preferred Embodiment

Figure 11:
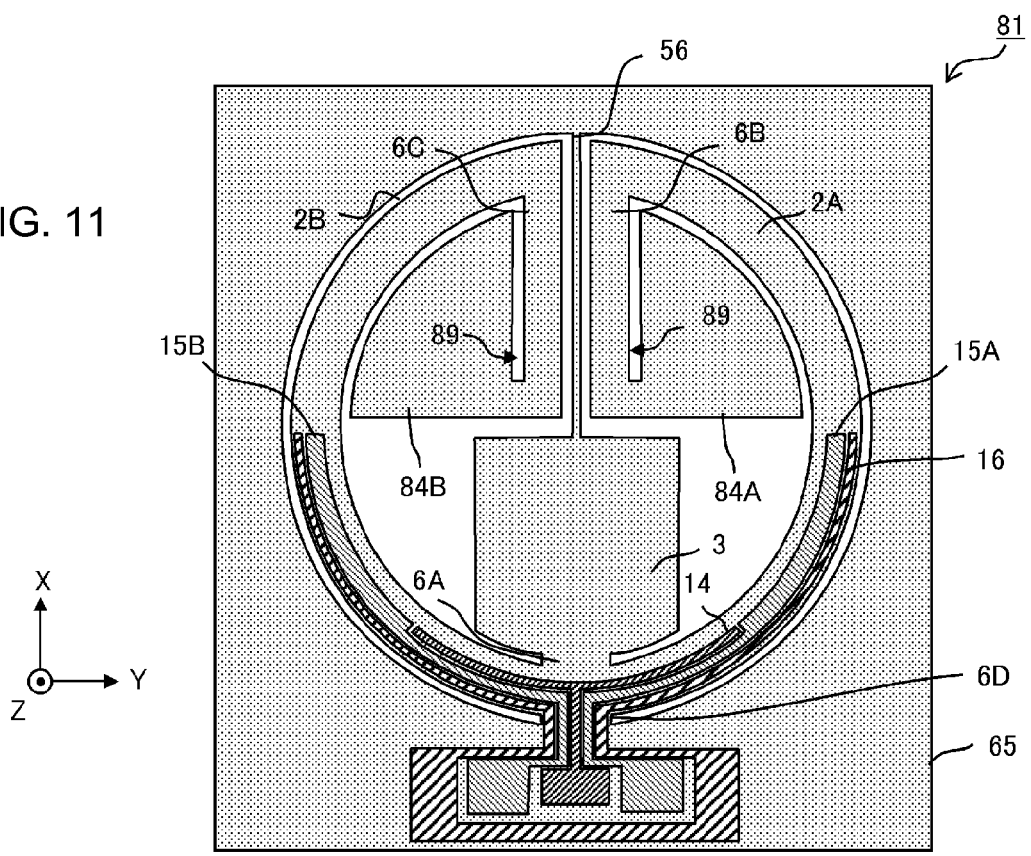
FIG. 11 is a diagram explaining a configuration of a vibrating gyroscope according to an eighth preferred embodiment of the present invention.

Next, a vibrating gyroscope 81 according to an eighth preferred embodiment of the present invention will be described. FIG. 11 is the plan view (X-Y plane plan view) of the vibrating gyroscope 81.

The vibrating gyroscope 81 adopts a configuration including first and second leading end-side weight portions 84A and 84B in which a slit 89 is provided, in place of the first and second leading end-side weight portions 4A and 4B in the vibrating gyroscope 61 in the sixth preferred embodiment. The slit 89 is provided so as to lengthen the joining portions 6B and 6C. In this configuration, by providing the slit 89, it is possible to lengthen the actual lengths of the first and second circular arc-shaped beam portions 2A and 2B, and it is possible to further decrease the resonant frequencies of the vibrations of the first and second circular or substantially circular arc-shaped beam portions 2A and 2B.

While the present invention may be implemented in such a way as illustrated in each of the above-mentioned preferred embodiments, the scope of the present invention is not limited to the preferred embodiments, and it is intended to include any modifications insofar as they are within the scope of the appended claims or the equivalents thereof.

For example, the driving portion or the detecting portion is not limited to an electromechanical conversion element utilizing a piezoelectric body film, and may also be configured as an element utilizing another principle, such as an electrostatic capacity. In addition, while here the vibrator and the electromechanical conversion element have configurations independent from each other, both of the two may also be integrally configured. The material of each portion, a manufacturing method therefor, or the shape thereof is not limited to the above-mentioned one, and the driving portion and the detecting portion may also be disposed in the different main surfaces of the vibrator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibrator comprising:
   a first circular or substantially circular arc-shaped beam portion and a second circular or substantially circular arc-shaped beam portion in which end portions on one side of a first axis direction face each other across a distance in a second axis direction perpendicular or substantially perpendicular to the first axis direction and end portions on the other side of the first axis direction are joined to each other;
   a base end-side weight portion disposed between the first circular or substantially circular arc-shaped beam portion and the second circular or substantially circular arc-shaped beam portion;
   a base end-side weight portion joining portion extending from a joining portion between the first circular or substantially circular arc-shaped beam portion and the second circular or substantially circular arc-shaped beam portion in the first axis direction, and joined to the base end-side weight portion;
   a first leading end-side weight portion joined to the end portion of the first circular or substantially circular arc-shaped beam portion on the one side of the first axis direction; and
   a second leading end-side weight portion joined to the end portion of the second circular or substantially circular arc-shaped beam portion on the one side of the first axis direction.

2. The vibrator according to claim 1, further comprising:
   a supporting-portion joining portion extending from the joining portion between the first circular or substantially circular arc-shaped beam portion and the second circular or substantially circular arc-shaped beam portion in a direction opposite to the base end-side weight portion joining portion; and
   a supporting portion joined to the supporting-portion joining portion.

3. The vibrator according to claim 2, wherein the supporting portion surrounds the first circular or substantially circular arc-shaped beam portion and the second circular or substantially circular arc-shaped beam portion.

4. The vibrator according to claim 3, further comprising a leading end-side supporting portion extending, in the first axis direction, from an end portion of the base end-side weight portion in the first axis direction, and joined to the supporting portion.

5. The vibrator according to claim 3, wherein the supporting portion is configured so that an inner circumference follows the first circular or substantially circular arc-shaped beam portion and the second circular or substantially circular arc-shaped beam portion.

6. The vibrator according to claim 2, wherein a dimension of the supporting portion in a third axis direction perpendicular or substantially perpendicular to the first axis direction and the second axis direction is larger than the first circular or substantially circular arc-shaped beam portion and the second circular or substantially circular arc-shaped beam portion.

7. A vibrating gyroscope comprising:
   the vibrator according to claim 1;
   a driving portion configured to drive the vibrator so that the vibrator vibrates in an in-plane vibration mode in which a distance between the end portions of the first circular or substantially circular arc-shaped beam portion and the second circular or substantially circular arc-shaped beam portion on the one side of the first axis direction changes; and
   a detecting portion configured to detect a vibration of an out-of-plane vibration mode in which the first circular or substantially circular arc-shaped beam portion and the second circular or substantially circular arc-shaped beam portion alternately bend in a third axis direction due to a Coriolis force applied to the vibrator by an angular velocity around a first axis, the vibrator vibrating in the in-plane vibration mode.

8. The vibrating gyroscope according to claim 7, wherein the vibrator includes a silicon substrate; and
   the driving portion and the detecting portion include a piezoelectric body film, a ground electrode, a driving electrode or a detection electrode.

9. The vibrating gyroscope according to claim 8, wherein the piezoelectric body film, the ground electrode, the driving electrode, and the detection electrode are provided on only one surface of the vibrator.

10. The vibrating gyroscope according to claim 9, wherein the driving portion and the detecting portion include a floating electrode; and
    the driving electrode or the detection electrode faces the floating electrode across the piezoelectric body film.

11. The vibrating gyroscope according to claim 9, wherein the driving electrode includes a first driving electrode facing the ground electrode across the piezoelectric body film, and a second driving electrode that faces the ground electrode across the piezoelectric body film and is adjacent to the first driving electrode.

12. The vibrator according to claim 1, wherein the base end-side weight portion defines a supporting portion.

13. The vibrator according to claim 1, further comprising a pad used for an external connection and provided in the base end-side weight portion, detection electrodes, and a ground electrode.

14. The vibrator according to claim 2, wherein the supporting portion includes a rectangular or substantially rectangular frame body including a rectangular or substantially rectangular aperture.

15. The vibrator according to claim 14, wherein the rectangular or substantially rectangular frame body surrounds the first and second circular or substantially circular arc-shaped beam portions.

16. The vibrator according to claim 2, wherein the supporting portion includes a rectangular or substantially rectangular frame body including a circular or substantially circular aperture.

17. The vibrator according to claim 16, wherein a dimension of the supporting portion in a Z-axis direction is larger than the first and second circular or substantially circular arc-shaped beam portions.

18. The vibrator according to claim 1, further comprising first and second leading end-side weight portions including a slit provided therein.

19. The vibrating gyroscope according to claim 7, wherein the driving portion and the detecting portion are defined by one of an electromechanical conversion element and an electrostatic capacitance element.

* * * * *